US012376413B2

United States Patent
Hsieh et al.

(10) Patent No.: US 12,376,413 B2
(45) Date of Patent: *Jul. 29, 2025

(54) LIGHT-EMITTING MODULE AND DISPLAY APPARATUS

(71) Applicant: EPISTAR CORPORATION, Hsinchu (TW)

(72) Inventors: Min-Hsun Hsieh, Hsinchu (TW); Jen-Chieh Yu, Hsinchu (TW); Chun-Wei Chen, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/669,153

(22) Filed: May 20, 2024

(65) Prior Publication Data

US 2024/0313146 A1 Sep. 19, 2024

Related U.S. Application Data

(63) Continuation of application No. 17/395,641, filed on Aug. 6, 2021, now Pat. No. 11,996,493.

(30) Foreign Application Priority Data

Aug. 7, 2020 (CN) .......................... 202010791217.4

(51) Int. Cl.
*H10F 55/15* (2025.01)
*G09G 3/32* (2016.01)
*H05B 45/12* (2020.01)

(52) U.S. Cl.
CPC ............... *H10F 55/15* (2025.01); *G09G 3/32* (2013.01); *H05B 45/12* (2020.01); *G09G 2320/0626* (2013.01)

(58) Field of Classification Search
None
See application file for complete search history.

(56) References Cited

U.S. PATENT DOCUMENTS

| 8,970,469 | B2 | 3/2015 | Nagashima |
| 9,685,428 | B2 | 6/2017 | Chang |
| 10,256,218 | B2 | 4/2019 | Kim et al. |
| 11,996,493 | B2 * | 5/2024 | Hsieh ..................... H01L 31/16 |

(Continued)

*Primary Examiner* — Sue A Purvis
*Assistant Examiner* — Jordan M Klein
(74) *Attorney, Agent, or Firm* — Patterson + Sheridan, LLP

(57) ABSTRACT

The present disclosure provides a light-emitting module and a display apparatus thereof. The light-emitting module includes a circuit substrate which includes a first surface and a second surface opposite to the first surface. The first surface includes a plurality of conductive channels, and the second surface includes a plurality of conductive pads. A plurality of light-emitting groups is arranged in a matrix on the first surface. Each of the light-emitting groups includes a red light-emitting diode chip, a green light-emitting diode chip, and a blue light-emitting diode chip. An electric component is disposed on the first surface and located in the light-emitting groups matrix. A translucent encapsulating component covers the plurality of light-emitting groups and the electric component. The light-emitting groups matrix comprises m columns and n rows.

14 Claims, 9 Drawing Sheets

(56) References Cited

U.S. PATENT DOCUMENTS

| | | | |
|---|---|---|---|
| 2012/0262434 A1* | 10/2012 | Nagashima | G09G 3/3426 345/207 |
| 2014/0232288 A1 | 8/2014 | Brandes et al. | |
| 2018/0323180 A1* | 11/2018 | Cok | H01L 23/5386 |
| 2019/0019780 A1* | 1/2019 | Kim | H01L 33/62 |

* cited by examiner

US 12,376,413 B2

LIGHT-EMITTING MODULE AND DISPLAY APPARATUS

RELATED APPLICATION DATA

This application is a continuation of U.S. patent application of Ser. No. 17/395,641, filed Aug. 6, 2021 which claims the right of priority of CN Application No. 202010791217.4, filed on Aug. 7, 2020, and the content of which is hereby incorporated by reference in their entirety.

TECHNICAL FIELD

The present disclosure is related to a light-emitting module with a specific structure and a display apparatus incorporating such light-emitting module.

DESCRIPTION OF BACKGROUND ART

The light-emitting diode (LED) has special properties, such as low power consumption, low heat radiation, long lifetime, high impact resistance, small volume, and high responding speed so LED is widely used in applications requiring light-emitting elements, such as vehicle, household electric appliance, display, or lighting fixture.

Taking the display apparatus as an example, LEDs are able to emit monochromatic light so that they can be assembled as a full color pixel unit in the display apparatus by combining red, green, and blue LED chips which emit three primary colors.

SUMMARY OF THE DISCLOSURE

One main purpose of the present disclose is to form a compact arranged light-emitting module including a plurality of light-emitting modules which is suitable to display the information by taking advantage of the packaging technology. Besides, another main purpose is to add the sensing function and the function of interacting with the outside world.

The present disclosure provides a light-emitting module. The light-emitting module includes a circuit substrate which includes a first surface and a second surface opposite to the first surface. The first surface includes a plurality of conductive channels, and the second surface includes a plurality of conductive pads. A plurality of light-emitting groups is arranged in a matrix on the first surface. Each of the light-emitting groups includes a red light-emitting diode chip, a green light-emitting diode chip, and a blue light-emitting diode chip. An electric component is disposed on the first surface and located in the light-emitting groups matrix. A translucent encapsulating component covers the plurality of light-emitting groups and the electric component. Wherein, the light-emitting groups matrix comprises m columns and n rows.

Furthermore, the present disclosure also provides a display apparatus. The display apparatus includes a carrier and a plurality of light-emitting modules located on the carrier. Each of the plurality of light-emitting modules includes a first light-emitting module and a second light-emitting module. Wherein, the electric component of the first light-emitting module and the electric component of the second light-emitting module are different types of electric components.

DETAILED DESCRIPTION OF PREFERRED EMBODIMENTS

Figure 1A:
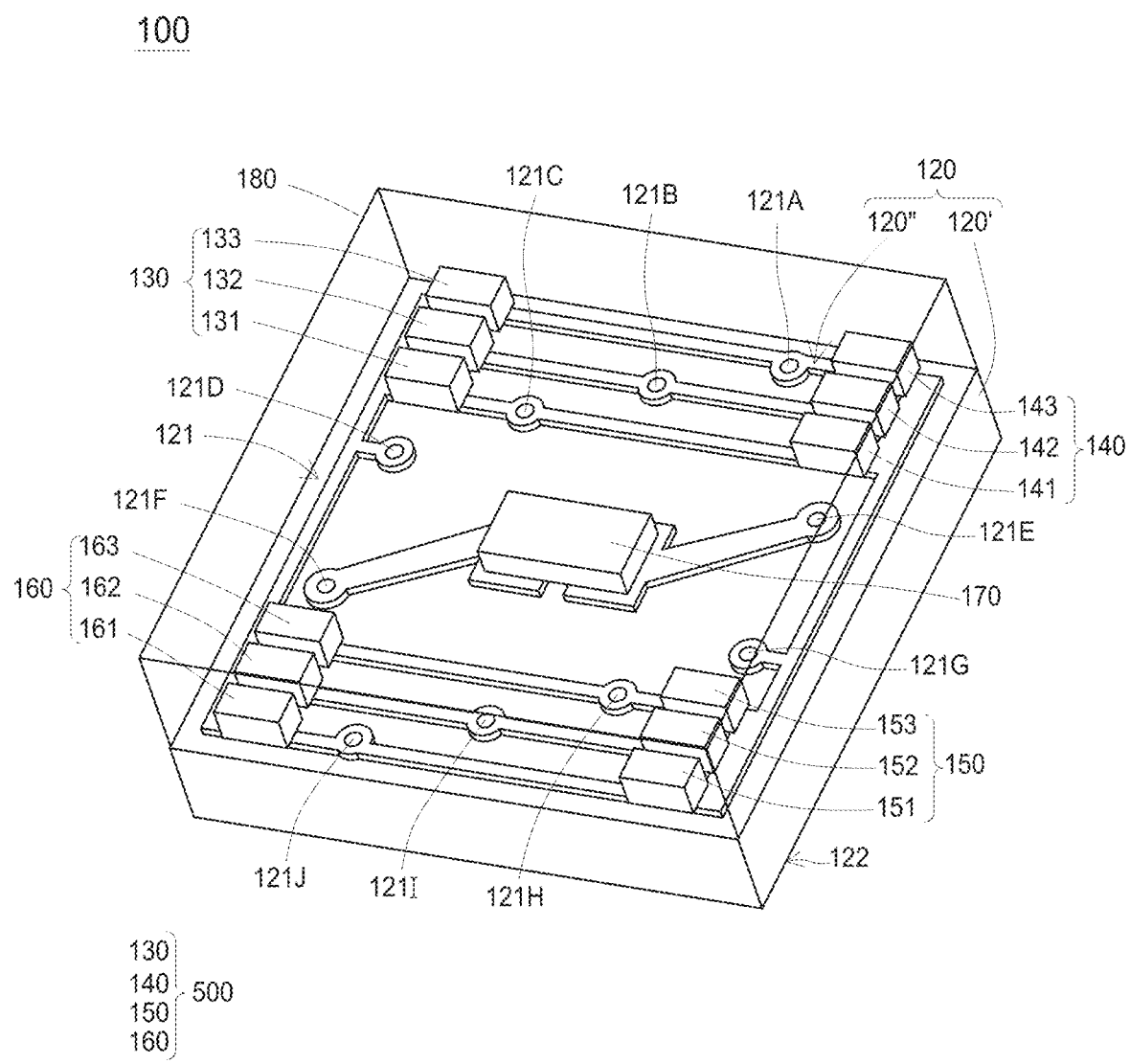
FIG. 1A shows a schematic diagram of a light-emitting module in accordance with one embodiment of the present disclosure.

The embodiments of the present disclosure are illustrated in details, and are plotted in the drawings. The same or the similar parts in the drawings and the specification have the same reference numeral. In the drawings, the shape and thickness of a specific element could be shrunk or enlarged. It should be noted that the element which is not shown in the drawings or described in the following description could be the structure well-known by the person having ordinary skill in the art.

Figure 1B:
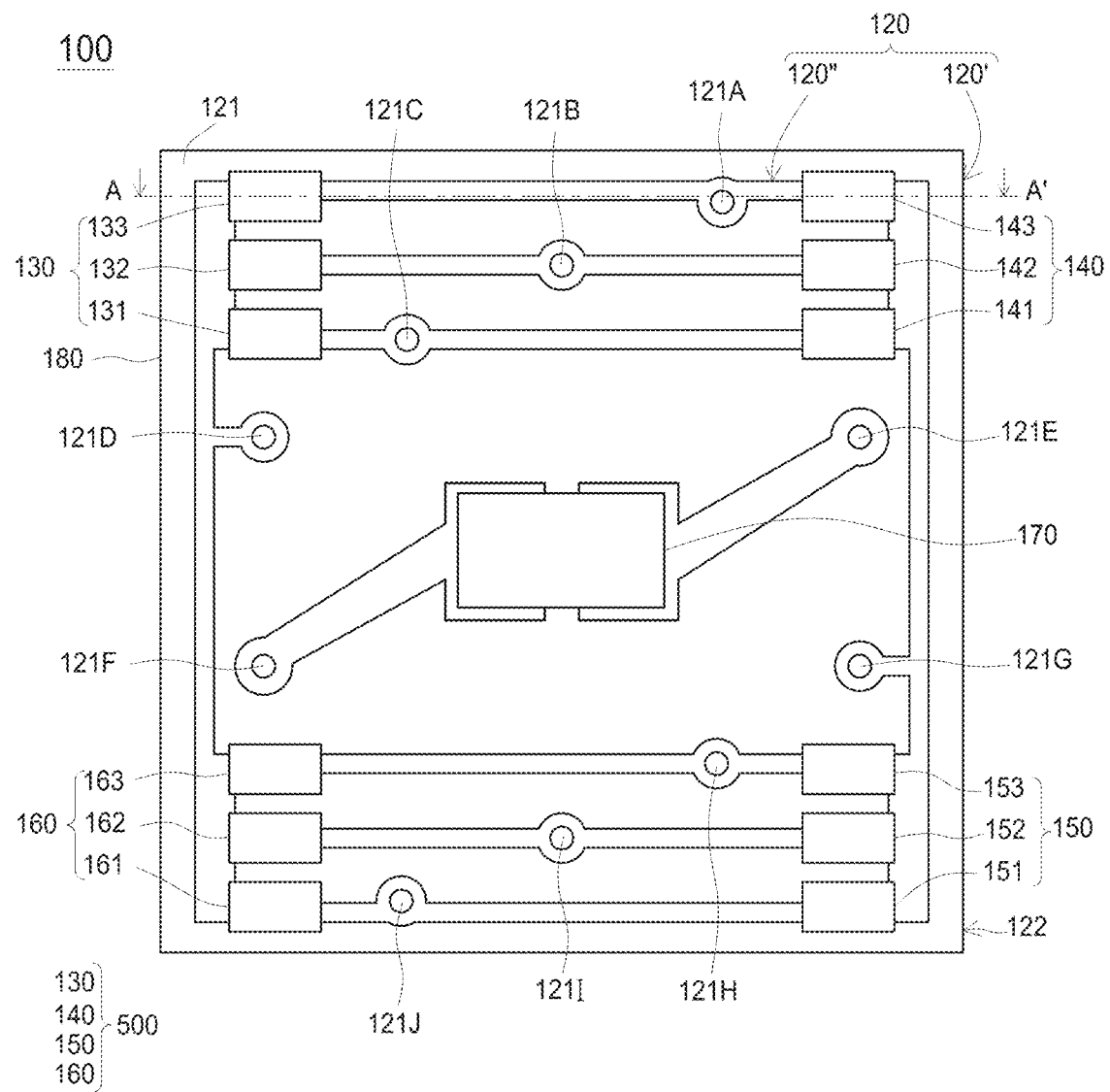
FIG. 1B shows a top view of a light-emitting module disclosed in FIG. 1A.
Figure 1C:
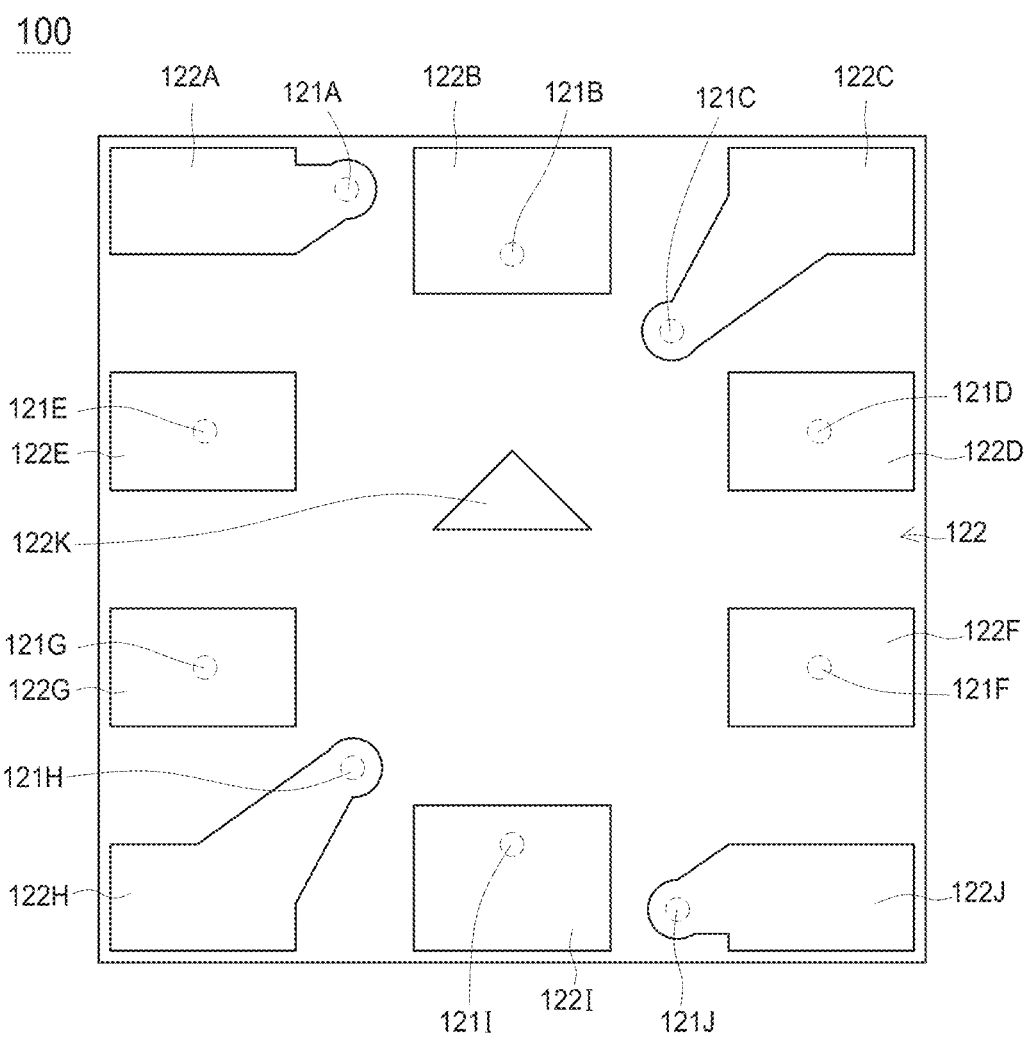
FIG. 1C shows a bottom view of a light-emitting module disclosed in FIG. 1A.

FIG. 1A discloses a schematic diagram of a light-emitting module 100 in accordance with one embodiment of the present disclosure, FIG. 1B is a top view thereof, and FIG. 1C is a bottom view thereof. The light-emitting module 100 includes a circuit substrate 120, a first light-emitting group 130, a second light-emitting group 140, a third light-emitting group 150, a fourth light-emitting group 160, an electric component 170, and a translucent encapsulating component 180.

As FIGS. 1A and 1B show, in the embodiment, the circuit substrate 120 is composed of an insulating substrate 120' and a top conductive layer 120", and the top conductive layer 120" includes a specific pattern. The circuit substrate 120 includes a first surface 121 and a second surface 122 opposite to the first surface 121. The first surface 121 includes a plurality of conductive channels 121A~121J passing through the circuit substrate 120. The first light-emitting group 130, the second light-emitting group 140, the third light-emitting group 150, and the fourth light-emitting group 160 are arranged in 2 columns and 2 rows on the top conductive layer 120" to collectively form a light-emitting groups matrix 500 while each light-emitting group 130, 140, 150, or 160 includes the light-emitting elements emitting different colors. To be more specific, each light emitting group 130, 140, 150, or 160 includes a red light-emitting diode chip 131, 141, 151, or 161 respectively, green light-emitting diode chip 132, 142, 152, or 162 respectively, and blue light-emitting diode chip 133, 143, 153, or 163 respectively. The electric component 170 is also arranged on the first surface 121 and is arranged in the light-emitting groups matrix 500. To be more specific, the electric component 170 is arranged between the columns and rows of the light-emitting groups matrix 500 and therefore is located in the light-emitting groups 130, 140, 150, or 160. Besides, the translucent encapsulating component 180 is arranged on the first surface 121 and covers the light-emitting groups matrix 500 and the electric component 170.

Referring to FIG. 1C, a plurality of conductive pads 122A~122J are arranged on the second surface 122, wherein the dotted circles 121A~121J represent the positions of the corresponding conductive channels 121A~121J which pass through from the first surface 121 of the circuit substrate 120 to the second surface 122. As shown in the figure, each conductive pad 122A~122J connects to each conductive channel 121A~121J, respectively. Besides, the second surface 122 further includes a triangular conductive pad 122K formed thereon. In this embodiment, there are 11 conductive pads formed on the second surface 122 of the light-emitting module 100.

The conductive pad 122K is disposed at the geometric center of the bottom view of the light-emitting module 100; is separated from all other conductive pads 122A~122J physically and is not connected to any of the conductive channels 121A~121J electrically. When the overall structure of the light-emitting module 100 is mirror-symmetrical in appearance, it is difficult to distinguish the orientation of the light-emitting module 100. In that case, the conductive pad 122K with an orientational appearance can be served as an orientation indicator for the light-emitting module 100. The orientational appearance is not limited to be a triangle, and can also be an odd-numbered polygon, an asymmetrical polygon, an even-numbered polygon with a leading angle.

The position where the conductive pad 122K is disposed on is not limited thereto and can be arranged at any appropriate position of the light-emitting module 100 to indicate the orientation of the light-emitting module 100. In addition, the conductive pads 122A~122K are generally made of metals with high thermal conductivity, such as copper, tin, aluminum, silver, or gold. In this embodiment, when the conductive pad 122K is disposed on the second surface 122 corresponding to the electric component 170, because it has the shortest distance from the electric component 170, the heat dissipation of the electric component 170 can be improved.

In this embodiment, the top conductive layer 120" serves as an electrical connection with the aforementioned light-emitting diode chips 131, 141, 151, 161, 132, 142, 152, 162, 133, 143, 153, and 163. The light-emitting diode chips 131, 141, 151, 161, 132, 142, 152, 162, 133, 143, 153, 163 are electrically connected to the conductive pads 122A~122J through the conductive channels 121A~121J, and the conductive pads 122A~122J are electrically connect to the external power source of the light-emitting module 100. Therefore, the conductive channels 121A~121J penetrating the insulating substrate 120' also connect the top conductive layer 120" to the conductive pads 122A~122J formed on the second surface. In addition, the conductive channels 121A~121J can be formed at the edges or in the inner portions of the insulating substrate 120' as long as the distance between any two neighboring conductive pads 122A~122J meets the relevant safety requirements.

The material of the insulating substrate 120' may be an epoxy resin, a bismaleimide triazine (BT) resin, a polyimide resin, a composite material of the epoxy resin and glass fibers, or a composite material of BT resin and glass fibers. The material of the top conductive layer 120" and the conductive channels 121A~121J may be metals, such as copper, tin, aluminum, silver, palladium, gold, alloys of the foregoing materials, or stacked layers of the foregoing materials. In one embodiment, when the light-emitting module 100 is used as a pixel of a display apparatus, a light-shielding structure (not shown) may be additionally formed on the first surface 121 of the circuit substrate 120. For example, a black coating layer or an anti-reflection layer, which can avoid the light from being reflected from the top conductive layer 120" and to modify the color difference between different insulating substrates 120'. Thus, the contrast of the display apparatus can be improved.

In this embodiment, the number of light-emitting groups is four (2×2), but it is not limited thereto. In another embodiment, the number of light-emitting groups may be m×n to form a light-emitting groups matrix 500 composed of a plurality of light-emitting groups in a manner of m columns and n rows. In addition, each light-emitting group 130 or 140 or 150 or 160 includes a red light-emitting diode chip 131, 141, 151, or 161 which can emit a first light having the dominant wavelength ($W_d$) or the peak wavelength ($W_p$) between 600 nm and 660 nm; a green light-emitting diode chip 132, 142, 152, or 162 which can emit a second light having the dominant wavelength ($W_d$) or the peak wavelength ($W_p$) between 515 nm and 575 nm; and a blue light-emitting diode chip 133, 143, 153, or 163 which can emit a third light having the dominant wavelength ($W_d$) or the peak wavelength ($W_p$) between 430 nm and 490 nm when a power thereon through a power supply is provided. The above wavelength ranges are only examples, and other color lights that can be used in displays can also be accomplished with the embodiments disclosed in the present disclosure.

Figure 1D:
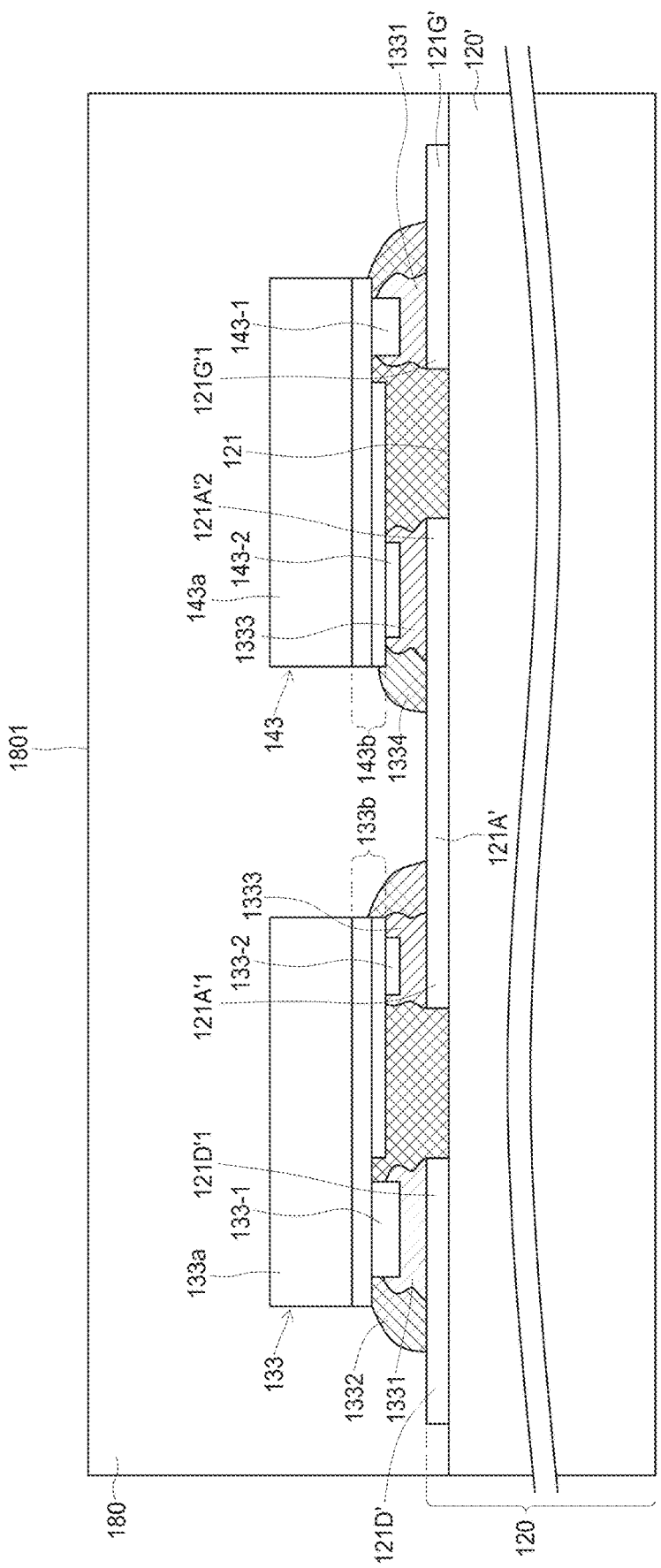
FIG. 1D shows a cross-sectional view of a light-emitting module along line A-A' disclosed in FIG. 1B.

FIG. 1D discloses a cross-sectional view of a light-emitting module 100 along line A-A' disclosed in FIG. 1B. In the embodiment, each of the blue light-emitting diode chips 133, 143 respectively includes a supporting substrate 133a or 143a, which can be optionally removed, a semiconductor epitaxial layer 133b or 143b, a cathode contact electrode 133-1 or 143-1, and an anode contact electrode 133-2 or 143-2. Each of the blue light-emitting diode chips 133, 143 has one side of the semiconductor epitaxial layer 133b or 143b facing the corresponding supporting substrate 133a or 143a and the other side thereof facing the corresponding contact electrodes 133-1, 133-2 or 143-1, 143-2. The supporting substrate 133a or 143a can be used to carry or support the corresponding semiconductor epitaxial layer 133b or 143b. In addition, the sides of the supporting substrates 133a or 143a away from the corresponding semiconductor epitaxial layer 133b or 143b, that is, the top surfaces of the blue light-emitting diode chips 133, 143, are the light-emitting surfaces of the blue light-emitting diode chips 133, 143. If there is no supporting substrates 133a, 143a, the light-emitting surfaces of the blue light-emitting diode chips 133, 143 are the uppermost surfaces of the semiconductor epitaxial layers 133b, 143b or the surfaces of the passivation layers (not shown) formed thereon.

In this embodiment, the supporting substrate 133a or 143a is a primary substrate such as sapphire for the semiconductor epitaxial layer 133b or 143b to be grown on. In another embodiment, the supporting substrate 133a or 143a is replaced by a translucent secondary substrate (non-growth substrate). The material of the secondary substrate can be alumina ceramic, glass, sapphire, diamond-like carbon, or quartz. The translucent secondary substrate is connected to the semiconductor epitaxial layer 133b or 143b through a translucent bonding layer (not shown).

As shown in the figure, the cathode contact electrodes 133-1, 143-1 and the anode contact electrodes 133-2, 143-2 of the blue light-emitting diode chips 133, 143 are respectively electrically connected to the top conductive layer 120" through a corresponding first electrical connection portions 1331 and a corresponding second electrical connection portions 1333. Each of the first electrical connection portions 1331 and each of the second electrical connection portions 1333 are further surrounded by a corresponding first protective portion 1332 and a corresponding second protective portion 1334 respectively. The contours of the first electrical connection portion 1331 and the second electrical connection portion 1333 may be a smooth surface or a concave and convex surface. In this embodiment, the first electrical connection portion 1331 and the second electrical connection portion 1333 have the contour of a neck. In other words, the first electrical connection portion 1331 has a width between the anode contact electrode 133-1 or 143-1 and the top conductive layer 120" which is smaller than the width at the interface of the first electrical connection portion 1331 and the top conductive layer 120". Similarly, the second electrical connection portion 1333 has a width between the cathode contact electrode 133-2 or 143-2 and the top conductive layer 120" which is smaller than the width at the interface of the second electrical connection portion 1333 and the top conductive layer 120". In this embodiment, most of the first electrical connection portion 1331 and the second electrical connection portion 1333 are composed of conductive materials, and the first electrical connection portion 1331 and the second electrical connection portion 1333 may respectively contain more or less impurities, such as air, the material of the protective part 1332/1334, residues in the manufacturing process, and/or pollutants. In another embodiment, the first electrical connection portion 1331 and the second electrical connection portion 1333 may all be composed of conductive materials. In another embodiment, the first protective portion 1332 may be located between the first electrical connection portion 1331 and the second electrical connection portion 1333, simultaneously wrapped around the first electrical connection portion 1331 and the second electrical connection portion 1333, and connected to the first surface 121 of the circuit substrate 120.

The first protective portion 1332 can not only protect the first electrical connection portion 1331 and the second electrical connection portion 1333 to avoid the oxidation of the conductive material by the external environment medium, but also prevent the first electrical connection portion 1331 and the second electrical connection portion 1333 from being short circuit caused by material softening or melting in a high temperature environment. In addition, the first protective portion 1332 can increase the bonding strength between the circuit substrate 120 and the blue light-emitting diode chip 133 or 143. In an embodiment, the first protective portion 1332 and/or the second protective portion 1334 are mainly composed of resin, and may also include a small amount of conductive material such as the material of the electrical connection portion 1331 or 1333. The conductive material in the first protective portion 1332 is present in a discontinuous form. In another embodiment, the first protective portion 1332 and/or the second protective portion 1334 are mainly composed of resin, but do not include conductive materials.

The conductive materials contained in the first electrical connection portion 1331, the second electrical connection portion 1333, the first protective portion 1332, and the second protective portion 1334 may be the same or different, for example, gold, silver, copper, tin, indium, bismuth, or its alloys. In one embodiment, the conductive material is a metal with a low melting point or an alloy with a low liquidus melting point. In one embodiment, the melting point or liquidus melting point of the metal or the alloy is lower than 210° C. In another embodiment, the melting point or liquidus melting point of the metal or the alloy is lower than 170° C. The material of the alloy with a low liquidus melting point may be a tin-indium alloy or a tin-bismuth alloy.

The resins contained in the first electrical connection portion 1331, the second electrical connection portion 1333, the first protective portion 1332, and the second protective portion 1334 may be the same or different, for example, a thermosetting resin. In one embodiment, the resin is a thermosetting epoxy resin. In one embodiment, the resin has a glass transition temperature (Tg), and Tg is greater than 50° C. In another embodiment, Tg of the resin is greater than 120° C.

In this embodiment, the translucent encapsulating component 180 covers the light-emitting groups 130, 140, 150, 160 and the electric component 170, and is in direct contact with the top conductive layer 120" and the first surface 121. As shown in FIG. 1D, the sidewalls of the translucent encapsulating component 180 and the sidewalls of the circuit substrate 120 may be coplanar, but in another embodiment, the sidewalls of the translucent encapsulating component 180 and the sidewalls of the circuit substrate 120 may be non-coplanar. The translucent encapsulating component 180 can protect the light-emitting groups matrix 500 and the electric component 170. In addition, the translucent encapsulating component 180 has a top surface 1801 that can serve as the main light-emitting surface of the light-emitting module 100 so the light emitted by the light-emitting groups 130~160 can pass through the top surface 1801 of the translucent encapsulating component 180. In an embodiment, the translucent encapsulating component 180 has a transmittance of greater than 80% for the wavelength bands of 440 nm to 470 nm, 510 nm to 540 nm, and 610 nm to 640 nm. In the embodiment, the refractive index of the translucent encapsulating component 180 is between 1.30 and 2.0. By changing the refractive index of the translucent encapsulating component 180, the light-emitting angle of the light-emitting module 100 can be adjusted. That is, the smaller the difference in refractive index of the material of the light-emitting surface of the translucent encapsulating component 180, such as the top surface 1801, and the material of the external environment, such as air, is, the greater the light-emitting angle could be. In another embodiment, the refractive index of the translucent encapsulating component 180 is between 1.35 and 1.70. In addition, the translucent encapsulating component 180 can also protect the top conductive layer 120" from being oxidized by the external environment, and/or the light-emitting elements in the light-emitting groups 130, 140, 150, 160 from falling off during use.

The material of the translucent encapsulating component 180 can be resin, ceramic, glass, or a combination of the above. In an embodiment, the material of the translucent encapsulating component 180 is a thermosetting resin, and the thermosetting resin may be epoxy resin or silicone resin. In one embodiment, the translucent encapsulating component 180 is composed of silicone resin, and the composition of the silicone resin can be adjusted according to the requirements of the required physical properties or optical properties. In one embodiment, the translucent encapsulating component 180 contains aliphatic silicone resin, such as methyl siloxane compound, so it has greater ductility and can withstand the thermal stress generated by the light-emitting groups 130, 140, 150, 160. In another embodiment, the translucent encapsulating component 180 contains aromatic silicone resin, such as phenyl siloxane compound, and therefore has a relatively large refractive index. In this way, the refractive index difference between the translucent encapsulating component 180 and the light-emitting groups 130, 140, 150, 160 can be reduced to improve the light extraction efficiency of the light-emitting groups 130, 140, 150, 160. That is to say, when the refractive index difference of the light-emitting groups 130, 140, 150, 160 and the material adjacent to the light-emitting surface of the light-emitting groups 130, 140, 150, 160 is smaller, the light-emitting angle is greater, and the light extraction efficiency can be improved even more. In one embodiment, the material of the light-emitting surface of the light-emitting groups 130, 140, 150, 160 is sapphire, which has a refractive index of about 1.77, and the material of the translucent encapsulating component 180 is a silicone resin containing aromatics, and its refractive index is greater than 1.50.

In this embodiment, the translucent encapsulating component 180 is transparent to red light wavelengths of 600 nm to 660 nm, green light wavelengths of 515 nm to 575 nm, and blue light wavelengths of 430 nm to 490 nm. In one embodiment, the translucent encapsulating component 180 is based on the same transparent material as described above, and is mixed with carbon black particles. When the light-emitting module 100 serves as a pixel of a display apparatus, the translucent encapsulating component 180 mixed with carbon black particles can be beneficial to the contrast. However, carbon black particles have light-absorbing properties, and the shorter the wavelength of light, the greater the absorption of carbon black particles. In a preferred embodiment, the translucent encapsulating component 180 contains carbon black particles greater than or equal to 0.005 wt % and less than 1 wt %. In another embodiment, the translucent encapsulating component 180 is based on the same transparent material as described above, and inorganic particle fillers are uniformly mixed therein. The inorganic particle fillers are, for example, fused silica particles, silica ($SiO_2$) particles, or metal particles. The inorganic particle fillers may have an average particle diameter of 100 μm or less. According to the different refractive index and reflectance characteristics of the added inorganic particle fillers, the light scattering ability of the translucent encapsulating component 180 and the light emission characteristics of the light-emitting module 100 as a whole can be changed. According to the hardness characteristics of the added inorganic particle fillers, the strengths of the translucent encapsulating component 180 and the light-emitting module 100 can be increased. In a preferred embodiment, in order to reduce the deterioration of the overall light transmittance of the light-emitting module 100 due to light scattering, the translucent encapsulating component 180 contains less than 50 wt % of inorganic particle fillers.

Figure 1E:
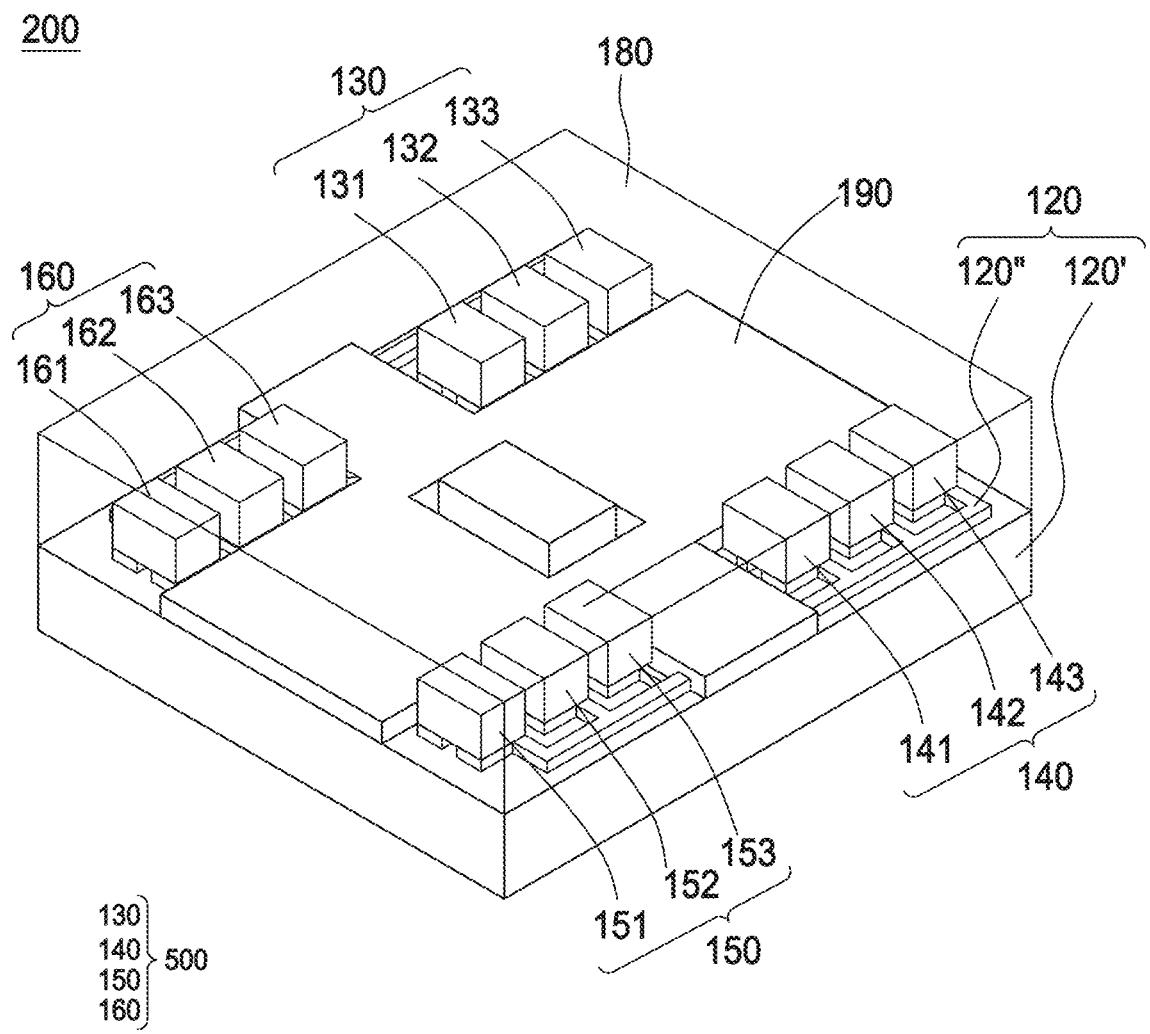
FIG. 1E shows a schematic diagram of a light-emitting module in accordance with another embodiment of the present disclosure.

FIG. 1E is a schematic diagram of another light-emitting module 200 disclosed according to another embodiment. In this embodiment, the arrangement and structure of the circuit substrate 120, the light-emitting groups 130, 140, 150, 160, the electric component 170, and the translucent encapsulating component 180 are substantially the same as those of the light-emitting module 100. The difference is that the light-emitting module 200 further includes a layer of light-shielding structure 190. The light-shielding structure 190 is located on the first surface 121, covers the top conductive layer 120″ located between the light-emitting groups 130, 140, 150, 160, and covers the conductive channels 121A~121J. The structure of the light-shielding structure 190 is, for example, a black coating layer or an anti-reflection layer to reduce the light reflection of the top conductive layer 120″ and modify the color difference between different insulating substrates 120′. Thus, the contrast of the light-emitting module 200 and the display apparatus incorporating the light-emitting modules 200 can be improved.

Figure 1F:
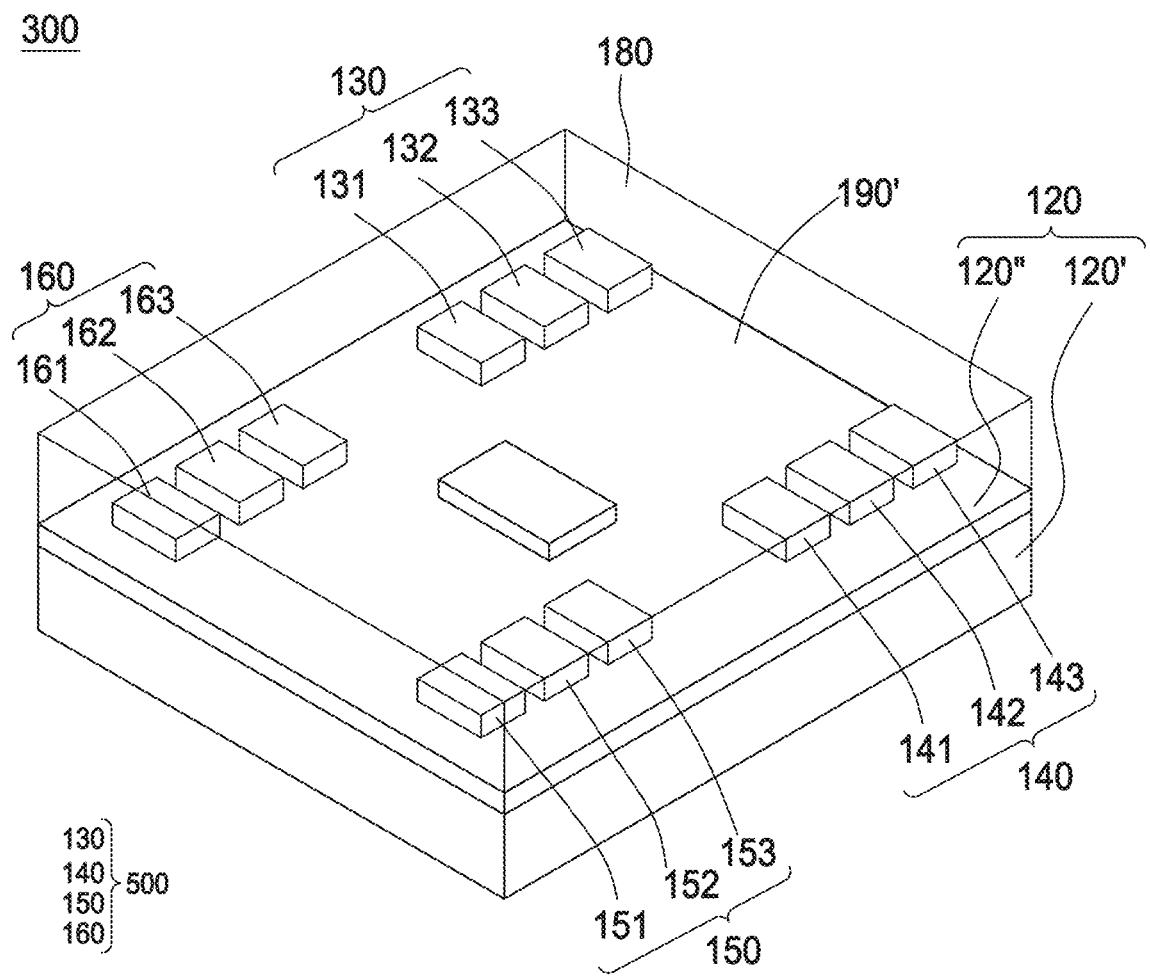
FIG. 1F shows a schematic diagram of a light-emitting module in accordance with another embodiment of the present disclosure.

FIG. 1F is a schematic diagram of another light-emitting module 300 disclosed in another embodiment. In this embodiment, the arrangement and structure of the circuit substrate 120, the light-emitting groups 130, 140, 150, 160, the electric component 170, and the translucent encapsulating component 180 are substantially the same as those of the light-emitting module 200. The difference is that the light-shielding structure 190′ included in the light-emitting module 300 covers the top conductive layer and conductive channels but not the light-emitting groups 130, 140, 150, 160 and the electric components 170. The structure of the light-shielding structure 190′ is, for example, a black coating layer or an anti-reflection layer. This design can reduce the light reflection of the top conductive layer 120″ and modify the color difference between different insulating substrates 120′ so that the contrast of the light-emitting module 300 and the display apparatus incorporating the light-emitting module 300 can be raised. The height of top surface of the light-shielding structure 190′ in this embodiment is slightly lower than the top surfaces of the light-emitting groups 130, 140, 150, 160 and the electric component 170, but the actual design is not limited thereto. Depending on the different implementations of the electric component 170, the material and height of the light-shielding structure 190′ also need to be adjusted appropriately, which will be described separately in subsequent embodiments.

Figure 2:
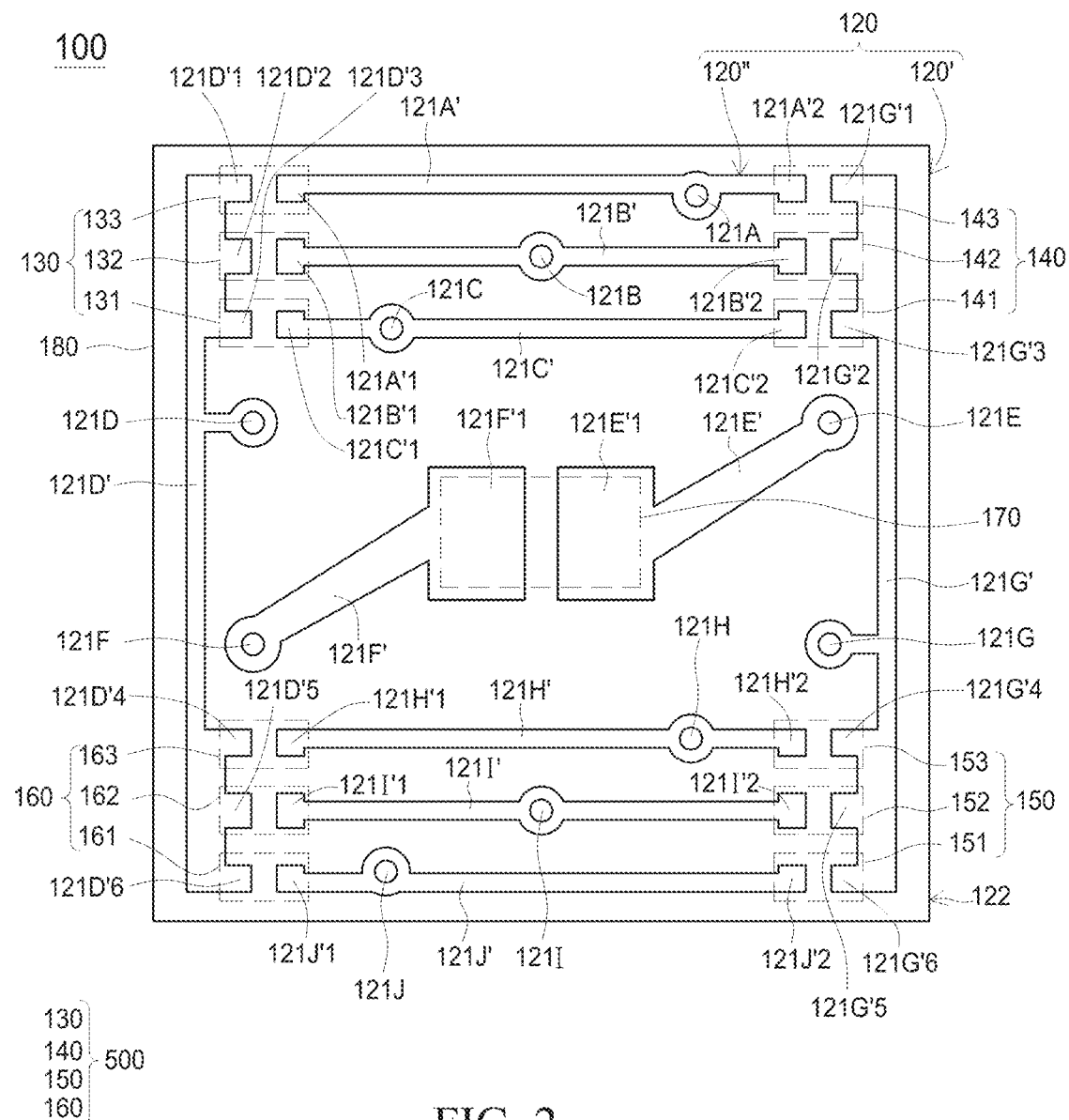
FIG. 2 shows a perspective view of the top surface of the circuit substrate of the light-emitting module disclosed in FIG. 1A.

FIG. 2 is a perspective view of the top surface of the circuit substrate of the light-emitting module 100. The light-emitting groups 130, 140, 150, 160 and the electric components 170 in the light-emitting module 100 are indicated by dotted lines. As shown in the figure, the top conductive layer 120″ has conductive lines 121A′~121J′ respectively electrically connected to the conductive channels 121A~121J, and the ends of each conductive line 121A′~121J′ also have conductive pads 121A′1 and 121A′2, 121B′1 and 121B′2, 121C′1 and 121C′2, 121D′1~121D′6, 121E′1, 121F′1, 121G′1~121G′6, 121H′1 and 121H′2, 121I′1 and 121I′2, and 121J′1 and 121J′2 respectively electrically connected to the aforementioned light-emitting diode chips 131, 141, 151, 161, 132, 142, 152, 162, 133, 143, 153, and 163. The detailed structures are described as follows.

As shown in FIG. 2, each of the conductive lines 121A′, 121B′, 121C′, 121H′, 121I′, 121J′ has a pair of enlarged conductive pads 121A′1 and 121A′2, 121B′1 and 121B′2, 121C′1 and 121C′2, 121H′1 and 121H′2, 121I′1 and 121I′2, and 121J′1 and 121J′2 at both ends thereof; each of the conductive lines 121D′ and 121G′ has enlarged comb-shaped conductive pads 121D′1~121D′6 and 121G′1~121G′6 at both ends thereof; and each of the conductive lines 121E′ and 121F′ has an enlarged conductive pad 121E′1 and 121F′1 at one end thereof. In a preferred embodiment, the width of the conductive pad is wider than the width of the corresponding conductive line so that contact electrodes of the aforementioned light-emitting diode chips and electric components can be independently electrically connected thereto through the aforementioned material of the electrical connection portion.

Referring to FIGS. 1B and 1D together and taking the cross-sectional view of the line A-A′ as an example, it can be seen from the cross-sectional view that the blue light-emitting diode chip 133 has a cathode contact electrode 133-1 and an anode contact electrode 133-2, and the blue light-emitting diode chip 143 has a cathode contact electrode 143-1 and an anode contact electrode 143-2. The cathode contact electrode 133-1 of the blue light-emitting diode chip 133 is electrically connected to the conductive pad 121D'1 of the conductive circuit 121D' through the first electrical connection portion 1331; the anode contact electrode 133-2 of the blue light-emitting diode chip 133 is electrically connected to the conductive pad 121A'1 of the conductive circuit 121A' through the second electrical connection portion 1333; the cathode contact electrode 143-1 of the blue light-emitting diode chip 143 is electrically connected to conductive pad 121G'1 of the conductive circuit 121G' through the first electrical connection portion 1331; the anode contact electrode 143-2 of the blue light-emitting diode chip 143 is electrically connected to the conductive pad 121A'2 of the conductive circuit 121A' through the second electrical connection portion 1333. As mentioned above, each of the conductive pads 121D'1, 121A'1, 121G'1, 121A'2 is electrically connected to each corresponding conductive channel 121D, 121A, 121G, 121A, further respectively electrically connected to the conductive pads 122D, 122A, 122G, and 122A located at the second surface 122 through the corresponding conductive channel 121D, 121A, 121G, and 121A, and then electrically connected to an external power source.

Similarly, in the light-emitting module 100, each of the red light-emitting diode chips 131, 141, 151, 161, the green light-emitting diode chips 132, 142, 152, 162, and the blue light-emitting diode chips 133, 143, 153, 163 respectively has a cathode contact electrode and an anode contact electrode (as shown in FIG. 1D), and each cathode contact electrode and anode contact electrode are electrically connected to the corresponding conductive pads 122A~122J located at the second surface 122.

In the present disclosure, the light-emitting module 100 further includes an electric component 170. The electric component is arranged at the central area of the light-emitting module 100 and does not overlap with the light-emitting groups matrix 500. In one embodiment, the electric component 170 is a single optical detector, which can be used to detect the luminous intensity of the red LED chips 131, 141, 151, 161, the green LED chips 132, 142, 152, 162, or the blue light-emitting diode chips 133, 143, 153, 163. When the optical detector is arranged at the central area of the light-emitting module 100, it is approximately equidistant from the four light-emitting groups 130, 140, 150, 160 in the light-emitting module 100 so it can receive the lights emitted from different light-emitting groups in the light-emitting module 100 and then convert them into electronic signals without deviation. Then, the electronic signals are transmitted to the rear processing unit (not shown), which can be used as a basis for the light output feedback control later, and the feedback control mechanism will be described in detail in the following section regarding the disclosure of the display apparatus.

Figure 3:
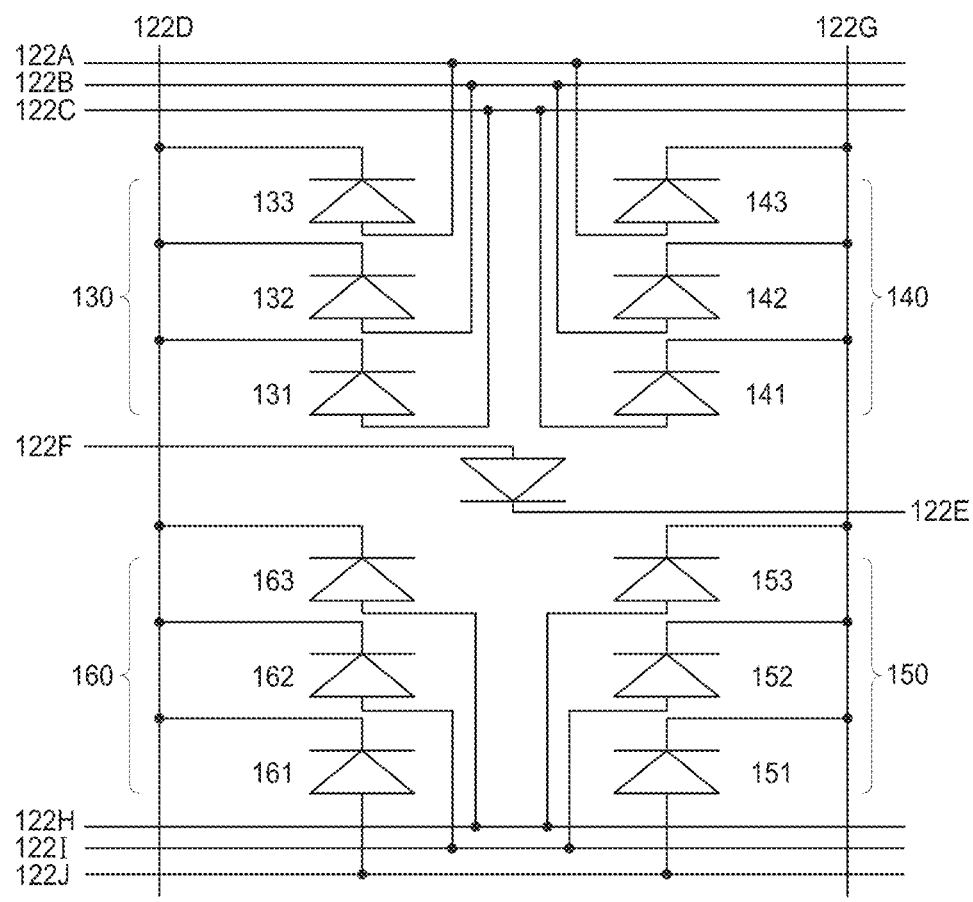
FIG. 3 shows a schematic diagram of an equivalent circuit of the light-emitting module disclosed in FIG. 1A.

FIG. 3 shows a schematic diagram 400 of an equivalent circuit of the light-emitting module 100. In FIG. 3, the positions of the electronic symbols representing the light-emitting diode chips correspond to the arrangement of the light-emitting diode chips 131~163 in the light-emitting module 100. In the light-emitting module 100, each of the light-emitting diode chips 131, 141, 151, 161, 132, 142, 152, 162, 133, 143, 153, 163 of the light-emitting groups 130, 140, 150, 160 respectively includes an anode contact electrode (not shown) and a cathode contact electrode (not shown).

From the perspective of the connection relationship of the light-emitting groups matrix 500, in the same vertical column, the cathode contact electrodes of all light-emitting diode chips are electrically connected to a same conductive pad. For example, the cathode contact electrodes of the light-emitting diode chips 131~133 and 161~163 are all electrically connected to the conductive pad 122D, and the cathode contact electrodes of the light-emitting diode chips 141~143 and 151~153 are all electrically connected to the conductive pad 122G. In the same horizontal row, the anode contact electrodes of the light-emitting diode chips emitting the same color are electrically connected to a same conductive pad. For example, the anode contact electrodes of the blue light-emitting diode chips 133 and 143 are electrically connected to the conductive pad 122A, the anode contact electrodes of the green light-emitting diode chips 132 and 142 are all electrically connected to the conductive pad 122B, and the anode contact electrodes of the red light-emitting diode chips 131 and 141 are all electrically connected to the conductive pad 122C, the anode contact electrodes of the blue light-emitting diode chips 163 and 153 are all electrically connected to the conductive pad 122H, the anode contact electrodes of the green light-emitting diode chips 162 and 152 are all electrically connected to the conductive pad 122I, and the anode contact electrodes of the red light-emitting diode chips 161 and 151 are all electrically connected to the conductive pad 122J. With this design, when the same anode voltage level is applied to all light-emitting diode chips through the conductive pads 122D and 122G, different voltage levels or different empower time can be applied to different conductive pads 122A~C and 122H~J, the light-emitting diode chips of different colors in the light-emitting module 100 are able to be controlled independently for the light-emitting brightness and/or the switching sequence. In addition, the number of conductive pads on the second surface 122 is also able to be reduced. In another embodiment, the anode contact electrodes of all the light-emitting diode chips can be electrically connected to a common conductive pad with the same voltage level, and then the light-emitting diode chips with different colors can be separately electrically connected to different cathode conductive pads. After applying different voltage levels and/or different empower time to the different cathode conductive pads of the light-emitting diode chips with different colors, it is possible to independently control the lighting brightness and/or the effect of the switching sequence of the light-emitting diode chips with different colors in the light-emitting module 100.

In one embodiment, the electric component 170 represents an integrated photodetector or several independent photodetectors. The electric component 170 can detect light of several different wavelength bands, for example, the light of red wavelength band between 600~660 nm, the light of green wavelength band between 515~575 nm, and the light of blue wavelength band between 430~490 nm. The two electrodes (not shown) of the electric component 170 are respectively electrically connected to the conductive pads 121F'1 and 121E'1, electrically connected to the conductive pads 122F and 122E through the conductive channels 121F and 121E, and electrically connected to the outside through the conductive pads 122F and 122E.

When the electric component in the light-emitting module is a single photodetector, an integrated photodetector, or several independent photodetectors, the structure of the light-emitting modules 200, 300 can be designed as those shown in FIGS. 1E and 1F. The electric component 170 is a light-receiving element that can receive light by its side surfaces. Therefore, when a light-shielding structure 190 or 190' is composed of a material transparent to the absorption wavelength of the electric component 170, the height of the top surface of the light-shielding structure 190 or 190' can be slightly lower than the top surfaces of the light-emitting groups 130, 140, 150, 160 and the electric component 170 as shown in FIGS. 1E and 1F. In another embodiment, the light-shielding structure 190 or 190' has a top surface having the same height as the top surface of anyone of the light-emitting groups 130, 140, 150, 160 and the electric components 170 or higher than the top surfaces of the light-emitting groups 130, 140, 150, 160 and the electric components 170. When the light-shielding structure 190 or 190' has a top surface higher than the top surfaces of the light-emitting groups 130, 140, 150, 160 and the electric components 170, the light-shielding structure 190 or 190' covers the entire top surfaces of the light-emitting groups 130, 140, 150, 160 and the electric components 170.

In another embodiment, the electric component 170 is a light-receiving element that can receive light by its top surface. Therefore, when a light-shielding structure 190 or 190' is composed of a material transparent to the absorption wavelength of the electric component 170, the light-shielding structure 190 or 190' has a top surface having the same height as the top surface of anyone of the light-emitting groups 130, 140, 150, 160 and the electric components 170 or higher than the top surfaces of the light-emitting groups 130, 140, 150, 160 and the electric components 170. When the light-shielding structure 190 or 190' has a top surface higher than the top surfaces of the light-emitting groups 130, 140, 150, 160 and the electric components 170, the light-shielding structure 190 or 190' covers the entire top surfaces of the light-emitting groups 130, 140, 150, 160 and the electric components 170.

In other words, when the electric component 170 is a light-receiving element and the light-shielding structure 190 or 190' is composed of a material transparent to the absorption wavelength of the electric component 170, the height of the light-shielding structure 190 or 190' is not limited by the height of the light-emitting groups 130, 140, 150, 160 and the electric components 170.

In another embodiment, when a light-shielding structure 190 or 190' is composed of a material opaque to the absorption wavelength of the electric component 170, the light-shielding structure 190 or 190' has a top surface having the same height as or lower than the top surface of the electric component 170. However, in order not to block the light collection, it is not suitable to cover the top surface of the electric component 170 by the light-shielding structures 190 and 190'. In all the aforementioned designs, the thickness of the light-shielding structures 190 and 190' should allow the light-emitting groups 130, 140, 150, 160 to transmit light, so as to achieve the functions of the light-emitting module 200 or 300 itself.

In an embodiment, the electric component 170 includes one or more light-emitting chips, which can emit one or more kinds of light with different wavelengths from that of the light-emitting groups matrix 500. For example, amber, cool white, warm white, or cyan. The cathode and anode electrodes (not shown) of the electric component 170 are respectively electrically connected to the conductive pads 121F'1 and 121E'1, electrically connected to the conductive pads 122F and 122E through the conductive channels 121F and 121E, and electrically connected to the outside through the conductive pads 122F and 122E. By adding the electric components 170 with different light-emitting wavelength bands and/or different color temperatures, the light-emitting module 100 can have multiple functions. For example, when being operated in a car, the light-emitting groups matrix 500 in the light-emitting module 100 can be used as an interactive taillight. If an amber light-emitting chip is included in the electric component 170 in the light-emitting module 100, the electric component 170 can have the function of a directional light.

When the electric component in the light-emitting module is one or more light-emitting chips, the structure of the light-emitting modules 200, 300 can be designed as those shown in FIGS. 1E and 1F. The electric component 170 includes a light-emitting chip. In this embodiment, the height of the top surface of the light-shielding structure 190 or 190' is slightly lower than the top surfaces of the light-emitting groups 130, 140, 150, 160 and the electric component 170 as shown in FIGS. 1E and 1F. In another embodiment, the top surface of the light-shielding structure 190 or 190' can be the same height as the top surface of anyone of the light-emitting groups 130, 140, 150, 160 and the electric components 170 or higher than the top surfaces of the light-emitting groups 130, 140, 150, 160 and the electric components 170. When the light-shielding structure 190 or 190' has a top surface higher than the top surfaces of the light-emitting groups 130, 140, 150, 160 and the electric components 170, the light-shielding structures 190 and 190' cover the entire top surfaces of the light-emitting groups 130, 140, 150, 160 and the electric components 170. In all the aforementioned designs, the thickness of the light-shielding structures 190 and 190' should allow the light-emitting groups 130, 140, 150, 160 and the electric component 170 to transmit light, so as to achieve the functions of the light-emitting module 200 or 300 itself.

In an embodiment, the electric component 170 is a non-optoelectronic component, such as a varistor or an integrated circuit (drive IC) which can drive the light-emitting module. The non-optoelectronic component can receive the external non-light signal to adjust the light emitting effect of the light-emitting module such as the light emission intensity. To be more specific, as a drive IC, it receives external electrical signal; as a varistor, it receives external pressure signal. The cathode and anode electrodes (not shown) of the electric component 170 are respectively electrically connected to the conductive pads 121F'1 and 121E'1, electrically connected to the conductive pads 122F and 122E through the conductive channels 121F and 121E, and electrically connected to the outside through the conductive pads 122F and 122E.

When the electric component in the light-emitting module is a non-optoelectronic component not emitting/receiving light, the structure of the light-emitting modules 200 and 300 can be designed as those shown in FIGS. 1E and 1F. Since the operation of the electric component 170 is not affected by light, the height of the light-shielding structure 190 or 190' is not limited by the height of the light-emitting groups 130, 140, 150, 160 and the electric components 170. In this embodiment, the height of the top surface of the light-shielding structure 190 or 190' can be slightly lower than the top surfaces of the light-emitting groups 130, 140, 150, 160 and the electric component 170 as shown in FIGS. 1E and 1F. In another embodiment, the top surface of the light-shielding structure 190 or 190' can be the same height as the top surface of anyone of the light-emitting groups 130, 140, 150, 160 and the electric components 170 or higher than the top surfaces of the light-emitting groups 130, 140, 150, 160 and the electric components 170. When the height of the top surface of the light-shielding structure 190 or 190' is higher than the top surfaces of the light-emitting groups 130, 140, 150, 160 and the electric components 170, the light-shielding structures 190 and 190' cover the entire top surfaces of the light-emitting groups 130, 140, 150, 160 and the electric components 170. In all the aforementioned designs, the thickness of the light-shielding structures 190 or 190' should be allow the light-emitting groups 130, 140, 150, 160 to transmit light, so as to achieve the functions of the light-emitting module 200 or 300 itself.

In another embodiment, the light-shielding structure 190 or 190' covers the full electric component 170 alone and expose the light-emitting groups 130, 140, 150, 160 so the function such as heat dissipation or the ability to receive pressure of the electric component 170 is not affected by the coverage of the light-shielding structure 190 or 190'. The light-shielding structure 190 or 190' has a uniform height in the light-emitting module so the light-shielding structure 190 or 190' has a flat uppermost surface in a single light-emitting module, but the disclosure is not limited to this. In another embodiment, the light-shielding structure 190 or 190' has different heights above and/or around the electric component 170 and the light-emitting groups 130, 140, 150, 160. That is, the light-shielding structure 190 or 190' has an uneven uppermost surface from the macro perspective. However, regardless of the surface type of the light-shielding structure 190 or 190', the light emission of the light-emitting groups 130, 140, 150, 160 should not be blocked.

Figure 4:
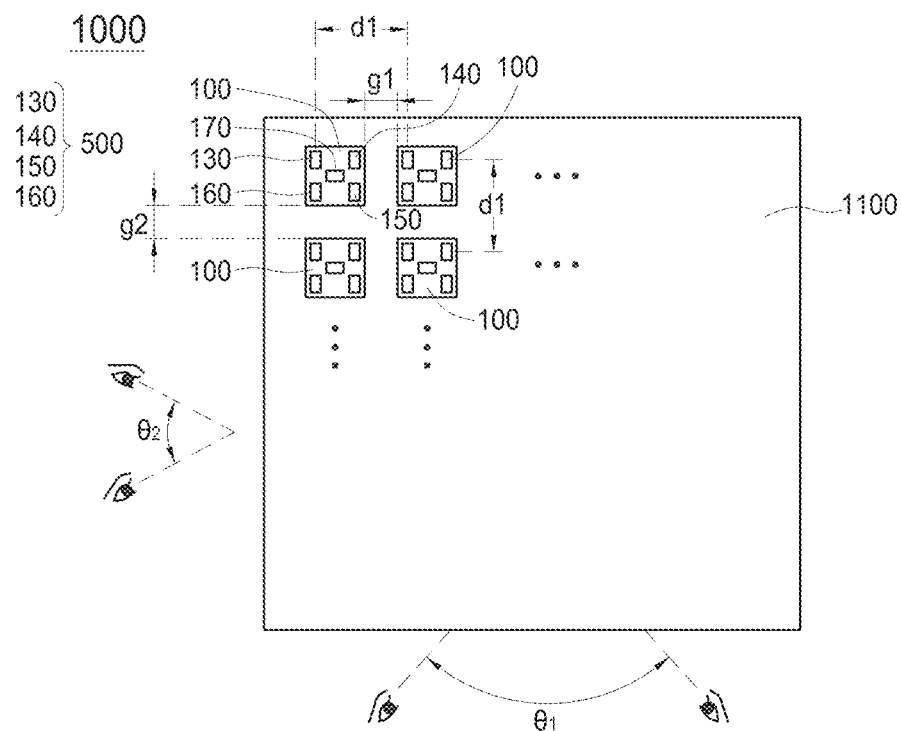
FIG. 4 shows a top view of a display apparatus in accordance with one embodiment of the present disclosure.

FIG. 4 shows a top view of a display apparatus 1000 composed of the aforementioned light-emitting modules 100. The display apparatus 1000 includes a target carrier 1100 and a plurality of light-emitting modules 100 fixed on the target carrier 1100 in a matrix pattern. In the display apparatus 1000, each light-emitting module 100 includes four light-emitting groups 130, 140, 150, and 160 that each can emit red, blue, and green light, and each of the light-emitting groups 130, 140, 150, and 160 can be one pixel in the display apparatus 1000. Multiple light-emitting modules 100 can be arranged and fixed onto the target carrier 1100 one after another or simultaneously. Along the X axis (horizontal), the distances between any two neighboring red light-emitting diode chips 131, 141, 151, 161, any two neighboring green light-emitting diode chips 132, 142, 152, 162, and any two neighboring blue light-emitting diode chips 133, 143, 153, 163 in the corresponding light-emitting groups 130, 140, 150, 160 in two adjacent light-emitting modules 100 are all d1, wherein the distance here is measured from the center points of the two same-color light-emitting diode chips along the X-axis direction. Along the Y axis (vertical), similarly, the distances between any two neighboring red light-emitting diode chips 131, 141. 151, 161, any two neighboring green light-emitting diode chips 132, 142, 152, 162, and any two neighboring blue light-emitting diode chips 133, 143, 153, 163 in the corresponding light-emitting groups 130, 140, 150, 160 in two adjacent light-emitting modules 100 are all also d1, wherein the distance here is measured from the center points of the two same-color light-emitting diode chips along the Y-axis direction. The distance d1 is determined according to the size of the target carrier 1100 and the resolution of the display apparatus 1000.

On the X axis, there is a gap g1 between two adjacent light-emitting modules 100, and on the Y axis, there is a gap g2 between two adjacent light-emitting modules 100. In one embodiment, the gap g1 and the gap g2 are between 5 μm and 1000 μm. The larger gap facilitates the subsequent replacement procedure of the failed light-emitting module 100. Under normal operation, the viewer of the display apparatus 1000 usually changes the viewing position along the X-axis (horizontal direction) and rarely changes the viewing position along the Y-axis (vertical direction). Therefore, the viewing angle θ1 along the X-axis (horizontal direction) of the display apparatus 1000 could be large. In other words, the light-emitting angle of the light-emitting groups 130, 140, 150, 160 on the X-axis (horizontal direction) is large and the light intensity distribution is uniform. In order to ensure that the color difference of the display apparatus 1000 in the viewing angle θ1 along the X-axis is minimized, as shown in FIG. 4, the difference in the light-emitting intensity distribution of the light-emitting groups 130, 140, 150, 160 along the X-axis can be reduced or can be consistent.

In one embodiment, since each light-emitting module 100 includes 4 light-emitting groups, when fabricating a display apparatus with the same resolution, the number of steps for arranging and fixing the light-emitting modules 100 on the target carrier 1100 is ¼ of the number of steps for arranging and fixing the light-emitting groups on the target carrier 1100, and therefore the process time can be greatly reduced.

In addition, in one embodiment, the electric component 170 is a photodetector. As mentioned above, when the photodetector 170 is arranged in the central area of each light-emitting module 100, it is approximately equidistant from the four light-emitting groups 130, 140, 150, 160 in the light-emitting module 100, and the electric component 170 can easily receive the same light-emitting intensity from the light-emitting groups 130, 140, 150, 160. In this embodiment, the display apparatus 1000 further includes an electronic signal receiving unit (not shown), a comparison unit (not shown), and a feedback controlling unit (not shown). When each electric component 170 on the display apparatus 1000 receives the specific color light, it converts the color light into an electronic signal and transmit the signal to the electronic signal receiving unit. After the electronic signal is received by the electronic signal receiving unit, it is compared by the comparison unit to compare whether each light-emitting module 100 reaches an appropriate brightness range. After comparison, when the light-emitting intensity of some of the light-emitting modules 100 is not within the appropriate brightness range, the feedback controlling unit can provide corresponding feedback control signals to the light-emitting modules 100 so that the brightness range of the light-emitting modules 100 can be adjusted accordingly. In another embodiment, the display apparatus 1000 may further include an environment sensing unit (not shown). The environment sensing unit can detect the brightness of the surrounding environment of the display apparatus 1000, and provide corresponding feedback controlling signals through the feedback controlling unit. For the light-emitting modules 100 in the display apparatus 1000, the light-emitting modules 100 can therefore correspondingly adjust the brightness to an appropriate brightness range according to the ambient brightness.

Figure 5:
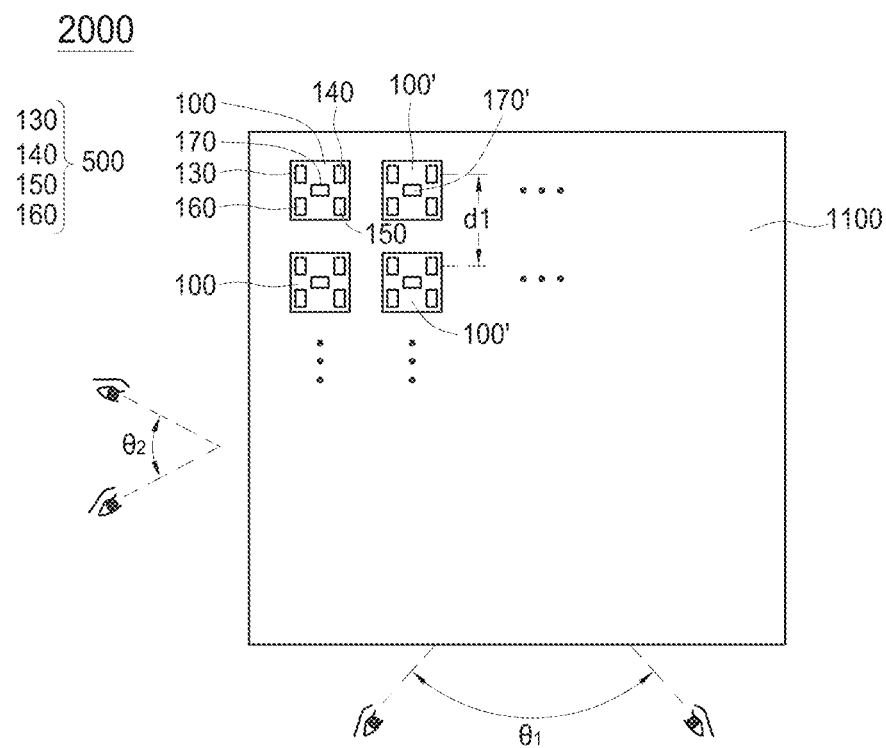
FIG. 5 shows a top view of a display apparatus in accordance with another embodiment of the present disclosure.

FIG. 5 is a top view of another display apparatus 2000 disclosed in another embodiment. In this embodiment, the display apparatus 2000 is composed of two or more types of light-emitting modules 100 and 100'. The electric components 170 and 170' included in the first light-emitting module 100 and the second light-emitting module 100' are different. In the first light-emitting module 100, the first electric component 170 is an infrared light-emitting element that can emit a fourth light; in the second light-emitting module 100', the second electric component 170' is an infrared light photodiode that can absorb infrared light. As shown in the figure, the first light-emitting module 100 and the second light-emitting module 100' are arranged in pairs on the display apparatus 1000. By detecting the time needed for receiving the infrared light which is emitted from the first electric component 170 and then reflected by the external objects and the amount of the received infrared light thereof, the distance between the external objects and the display apparatus 2000 can be measured. Furthermore, in the entire display apparatus 2000, the combination of the first light-emitting modules 100 and the second light-emitting modules 100' can be used to confirm the movement/gesture in order to detect the relative position thereof, so as to achieve the function of an interactive screen.

Although the present disclosure has been explained above, it is not the limitation of the range, the sequence in practice, the material in practice, or the method in practice. Any modification or decoration for present disclosure is not detached from the spirit and the range of such.

What is claimed is:

1. A light-emitting apparatus, comprising:
   a carrier;
   a first light-emitting module located on the carrier, comprising:
   a first circuit substrate, comprising a first surface, a second surface opposite to the first surface, a plurality of first conductive channels arranged on the first surface, and a plurality of first conductive pads arranged on the second surface;
   a first light-emitting group arranged on the first surface, and comprising a first red light-emitting diode chip, a first green light-emitting diode chip, and a first blue light-emitting diode chip;
   a first electric component disposed on the first surface; and
   a first translucent encapsulating component covering the first light-emitting group and the first electric component; and
   a second light-emitting module located on the carrier, comprising:
   a second circuit substrate, comprising a third surface, a fourth surface opposite to the third surface, a plurality of second conductive channels arranged on the third surface, and a plurality of second conductive pads arranged on the fourth surface;
   a second light-emitting group arranged on the third surface, and comprising a second red light-emitting diode chip, a second green light-emitting diode chip, and a second blue light-emitting diode chip;
   a second electric component disposed on the third surface; and
   a second translucent encapsulating component covering the second light-emitting group and the second electric component;
   wherein the first electric component is an infrared light-emitting diode, and the second electric component is an infrared photodiode.

2. The light-emitting apparatus according to claim 1, wherein the first light-emitting module further comprises a plurality of first light-emitting groups which comprises the first light-emitting group and is arranged on the first surface to collectively form a first light-emitting groups matrix, and the first light-emitting groups matrix is arranged in m columns and n rows.

3. The light-emitting apparatus according to claim 2, wherein the plurality of first conductive pads comprises 11 conductive pads, and one of the 11 conductive pads is not electrically connected to any of the light-emitting diode chips.

4. The light-emitting apparatus according to claim 2, wherein the first red light-emitting diode chip, the first green light-emitting diode chip, and the first blue light-emitting diode chip each comprises an anode contact electrode, and the anode contact electrode of the first red light-emitting diode chip, the first green light-emitting diode chip, and the first blue light-emitting diode chip are electrically connected to one of the plurality of first conductive pads.

5. The light-emitting apparatus according to claim 1, wherein one of the plurality of first conductive pads is electrically connected to the first electric component.

6. The light-emitting apparatus according to claim 1, wherein the first translucent encapsulating component comprises carbon black particles.

7. The light-emitting apparatus according to claim 6, wherein the carbon black particles are greater than or equal to 0.005 wt % and less than 1 wt % in the first translucent encapsulating component.

8. The light-emitting apparatus according to claim 1, wherein the first translucent encapsulating component comprises inorganic particle fillers.

9. The light-emitting apparatus according to claim 1, wherein the first electric component is substantially disposed on a center of the first light-emitting module in a top view.

10. The light-emitting apparatus according to claim 1, further comprising a light-shielding structure located on and directly contacting the first surface.

11. The light-emitting apparatus according to claim 10, wherein the light-shielding structure comprises an uneven top surface.

12. The light-emitting apparatus according to claim 1, further comprising an electronic signal receiving unit for receiving electronic signals emitted by the first light-emitting module and the second light-emitting module.

13. The light-emitting apparatus according to claim 12, further comprising a comparison unit to compare whether the first light-emitting module reaches an appropriate brightness range.

14. The light-emitting apparatus according to claim 1, further comprising a feedback controlling unit electrically connected to the first light-emitting module for controlling a brightness of the first light-emitting module.

* * * * *